United States Patent [19]

Ueno et al.

[11] Patent Number: 4,621,275
[45] Date of Patent: Nov. 4, 1986

[54] SOLID-STATE IMAGING DEVICE

[75] Inventors: Atushi Ueno, Hirakata; Tadao Komeda, Ikoma, both of Japan

[73] Assignee: Matsushita Electric Industrial Co., Ltd., Osaka, Japan

[21] Appl. No.: 603,813

[22] Filed: Apr. 25, 1984

[30] Foreign Application Priority Data

Apr. 30, 1983 [JP] Japan ................................. 58-77131
Apr. 30, 1983 [JP] Japan ................................. 58-77132

[51] Int. Cl.⁴ .......................................... H01L 27/14
[52] U.S. Cl. ....................................... 357/30; 357/24
[58] Field of Search ............... 357/30, 31, 84, 24 LR, 357/59, 68, 24

[56] References Cited

U.S. PATENT DOCUMENTS 3,969,751 7/1976 Drukaroff et al. ..................... 357/30
4,271,424 6/1981 Inayoshi et al. ....................... 357/68

FOREIGN PATENT DOCUMENTS 0024171 2/1982 Japan ..................................... 357/30
0140157 8/1983 Japan ..................................... 357/30

Primary Examiner—James W. Davie
Assistant Examiner—Georgia Y. Epps
Attorney, Agent, or Firm—Spencer & Frank

[57] ABSTRACT

A solid-state imaging device comprising a semiconductor circuit substrate having regions for storage and transfer of signal charges, an insulating film formed on the substrate and a photoconductive film. A light shielding member is provided in the insulating film on the semiconductor circuit substrate. An opening is formed in the insulating film in registry with the charge storage region and an electroconductive film is embedded in the opening. With this construction of the device, blooming is suppressed and the characteristics of the photoconductive film are improved.

8 Claims, 11 Drawing Figures

SOLID-STATE IMAGING DEVICE

BACKGROUND OF THE INVENTION

This invention relates to solid-state imaging devices and more particularly to a lamination type solid-state imaging device in which a photoconductive film is formed on a semiconductor substrate having a charge transfer or switching function and a method of producing such a device.

Conventionally, a solid-state imaging device has been known which has, in combination, a photoconductive film and a circuit element such as a CCD (charge coupled device) having a charge transfer function or an X-Y matrix element having MOS switches arranged in matrix and driven by an X-Y shift register to read signals. Typically, this type of solid-state imaging device comprises, as shown in FIG. 1a, a P-type semiconductor circuit substrate 1, an N+-type source region 2a, an N-type drain region 2b, a gate insulating film 3, a gate electrode 4, a first insulating film 5, a second insulating film 6, a metal electrode 7 divided in unit of picture element, a positive hole blocking layer 8, a photoconductive film 9 for conversion of incident light into electric charge, and a transparent electrode 10. The metal electrode 7 constitutes a unit picture element electrode corresponding to a separate picture element and is electrically connected to the N+-type source region 2a of the semiconductor substrate 1. The source region 2a also functions to store an electric charge representative of a photo-signal (hereinafter simply referred to as signal charge) created in the photoconductive film 9. Thus, a MOS switch is constituted by the source region 2a, drain region 2b and gate electrode 4. FIG. 1b is a plan view of a lower portion of the semiconductor circuit substrate which underlies the gate electrode 4. Referring to FIG. 1b, electrons are stored in the N+-type source region 2a and written into the N-type drain region (transfer region) 2b by the action of the gate electrode 4. The thus written electrons are transferred sequentially by the action of a transfer gate electrode 4a in a longitudinal direction depicted by a dotted arrow. A CCD structure comprised of the transfer region 2b, gate insulating film 3 and gate electrodes 4, 4a participates in the transfer of electrons when suitable clock pulses are applied to the gate electrodes 4 and 4b. FIG. 1a corresponds to a sectional profile (of one picture element) taken on line W—W' in FIG. 1b.

With the conventional device, light $l_1$ incident on the transparent electrode 10 opposing the metal electrode 7 is absorbed by the photoconductive film 9 having a surface area opposing a surface area of the metal electrode 7 to create electron-positive hole pairs so that electrons are stored in the N+-type source region 2a to behave as signal charges. However, light $l_2$ is not absorbed by the transparent electrode 10 and photoconductive film 9 and it passes through a gap formed in the metal electrode 7 to reach the semiconductor substrate 1, thus creating therein electron-positive hole pairs. While the thus created positive holes penetrate into the substrate 1, the electrons immigrate into the N+-type source region 2a for storage of optical information and a charge transfer stage of the CCD or the N-type drain region 2b of the MOS switch. The N-type drain region 2b contributes to transfer of electrons generated in the separate picture element extending in the longitudinal direction. Consequently, the electrons created in the semiconductor circuit substrate 1 and immigrating into the N-type drain region 2b as described previously are spread in the longitudinal direction (transfer direction depicted by dotted arrow), thereby causing a so-called blooming phenomenon whereby spurious signals appear at portions where valid signals are absent.

To prevent such a phenomenon, an expedient has been proposed which is disclosed in Japanese Patent Application Laid-open No. 103934/80. According to this proposal, as shown in FIG. 2, a light shielding member (film) 11 for covering the separation gap formed in a metal electrode 7 is interposed between a first insulating film 5 and a second insulating film 6. In FIG. 2, identical components to those in FIG. 1a are designated by identical numerals and will not be described herein. The structure of FIG. 2 still suffers from the following disadvantages. Firstly, if the light shielding film 11 is not in registry with the gap in the metal electrode 7, the light $l_2$ reaches the substrate 1. Secondly, if the second insulating film 6 is thick, the light $l_2$ is liable to leak transversely of the film 6. Especially, a raised portion overlies the substrate near the gate electrodes 4 and 4a as shown in FIG. 2, and the incident light undergoes irregular reflection by the raised portion to aggravate the leakage of light. Conversely, if the second insulating film 6 is thin, there occurs a tendency to short-circuit between the metal electrode 7 and the light shielding member 11. In addition, under the application of high voltage clock pulses to the gate electrodes 4 and 4a, noise tend to occur which, in turn, affect the metal electrode 7 through a stray capacitor between the gate electrode 4 or 4a and the metal electrode 7 to thereby degrade the quality of the images.

Moreover, a highly raised portion overlying the N+-type source region 2a disturbs crystal structures in the positive hole blocking layer 8 and photoconductive film 9 to increase the dark current.

SUMMARY OF THE INVENTION

An object of the present invention is to provide a solid-state imaging device which can assure completeness of light shielding for considerably suppression of the blooming and which can reduce stray capacitance between the metal electrode for collection of electric charges generated in the photoconductive film and the gate electrode.

Another object of the present invention is to provide a method of producing a solid-state imaging device which can precisely control the formation of a light shielding member in a self-alignment manner without resort to a photo etching process and which can flatten the surfaces of components to improve the characteristics of the photoconductive film.

According to this invention, in a solid-state imaging device comprising a semiconductor circuit substrate having a transfer region for transfer of signal charges stored in a region for storage of photo signal charges, an insulating film formed on the semiconductor circuit substrate, an electrode divided into units of picture element which overlie the insulating film and are electrically conducted to the storage region of the semiconductor circuit substrate through an opening formed in the insulating film, a photoconductive film formed on the electrode, and a transparent electrode formed on the photoconductive film, a light shielding electroconductive member is provided in the insulating film except the opening thereof to cover the entire surface of the transfer region so that the blooming can be suppressed and electrical shielding can be established between the electrode and the transfer region. Etching is applied for simultaneous formation of the opening in the insulating film and an opening in registry therewith in the shielding member to precisely control the production of the solid-state device without resort to a mask dedicated to the formation of the openings.

Specifically, according to the present invention, an electroconductive film such as a polycrystal silicon film is embedded in a recess overlying the storage region in a self-alignment manner, and the surface of the electroconductive film is flattened to improve characteristics of the photoconductive film to be laminated on the electroconductive film.

BRIEF DESCRIPTION OF THE DRAWINGS

FIG. 1b is a fragmentary plan view of the device shown in FIG. 1a.

DESCRIPTION OF THE PREFERRED EMBODIMENTS

Figure 1A:
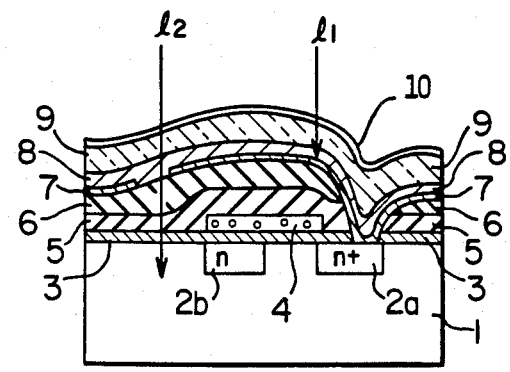
FIGS. 1a and 2 are sectional views showing prior art solid-state imaging devices.
Figure 1B:
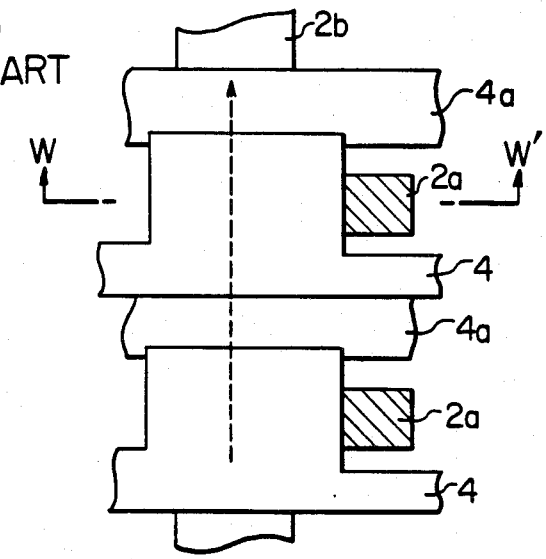
Figure 2:
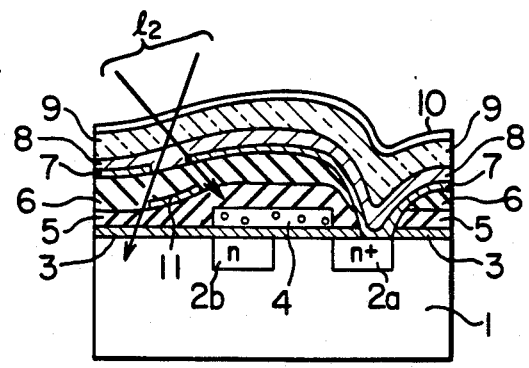
Figure 3:
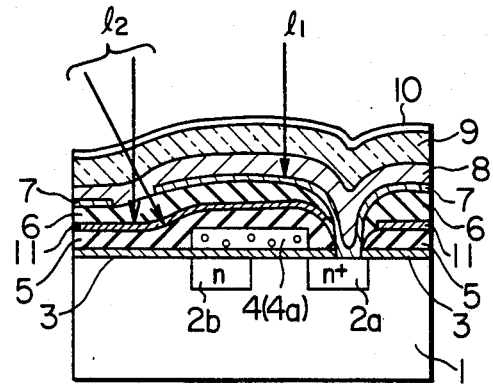
FIG. 3 is a sectional view showing a solid-state imaging device embodying this invention.

FIG. 3 shows a sectional structure of a solid-state imaging device according to an embodiment of the present invention. In FIG. 3, identical components to those of FIGS. 1 and 2 are designated by identical numerals. The solid-state imaging device of FIG. 3 comprises a circuit substrate 1 of P-type silicon, an N+-type source region 2a and an N-type drain region 2b both formed in the substrate 1, the former region being adapted to store signal charges and the latter region being adapted to transfer signal charges written thereinto, a gate insulating film 3 and gate electrodes 4 and 4a. The N-type drain region 2b, gate insulating film 3 and gate electrodes 4 and 4a constitute a signal charge transfer region. The device also comprises a first insulating film 5, a second insulating film 6, a metal electrode 7 divided in units of picture elements and electrically led to a portion of the N+-type source region 2a through openings formed in the insulating films 5 and 6, a positive hole blocking layer 8, a photoconductive film 9 and a transparent electrode 10, thus completing the same construction as that explained with reference to FIG. 1.

According to teachings of the present invention, a light shielding electroconductive member or film 11 is additionally provided between the first and second insulating films 5 and 6 to cover the entirety of the signal charge transfer region excepting the opening through which the metal electrode 7 passes, and the shielding film 11 is patterned simultaneously with the formation of the openings in the insulating films 5 and 6 by etching in a self-alignment manner.

In the solid-state imaging device of the construction described as above, incident light $l_1$ from above on a sheet of the drawing is absorbed by the transparent electrode 10 and photoconductive film 9 to create electron-positive hole pairs. While the positive hole is trapped by the positive hole blocking layer 8, the electron behaving as optical information is absorbed by the metal electrode 7 corresponding to a unit picture element region and stored in the N+-type source region 2a connected to the metal electrode 7. On the other hand, light $l_2$, which has not been absorbed by the photoconductive film 9 and transmitted through a gap formed in the metal electrode 7 serving as the unit picture element region, is perfectly blocked or interrupted by the light shielding member 11 so as to be prevented from reaching the substrate 1. As a result, carriers which would otherwise be created in the semiconductor substrate 1 can be eliminated. The shielding member 11 needs to cover at least the signal charge transfer region so that substantially the entire surface of the circuit substrate 1 excepting the storage region 2a can be covered with the shielding member 11. Consequently, no problem of light leakage occurs even when registry of the metal electrode 7 is slightly disturbed. If the shielding member 11 is connected to ground potential, noises generated by the application of high voltage clock pulses to the gate electrodes 4 and 4a can be shielded electrically.

It will be appreciated that the solid-state imaging device of the above construction can suppress the blooming phenomenon considerably.

According to the invention, a method is provided for producing a solid-state imaging device in which the surface of the substrate component is flattened to improve the characteristics of the photoconductive film, as will be described with reference to FIGS. 4a to 4e.

Figure 4A:
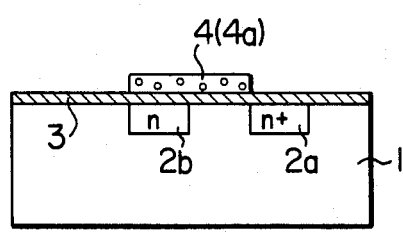
FIGS. 4a to 4e are sectional views useful in explaining a method of producing a solid-state imaging device embodying this invention.
Figure 4B:
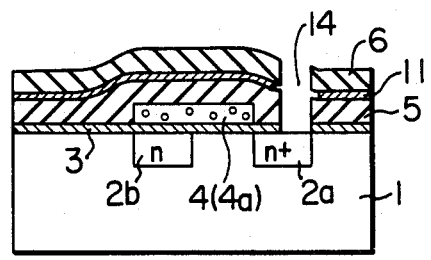

Referring to FIG. 4a, an N-type impurity is first doped into a desired portion of a P-type substrate 1 such as a silicon substrate having a resistivity of 10 Ωcm to form a drain region 2b, and N-type impurity is then doped at a higher concentration into another desired portion of the P-type substrate 1 to form a source region 2a. Subsequently, a gate insulating film 3 of about 0.1 μm thickness is formed on the substrate to cover the drain and source regions, and polycrystal silicon films of about 0.5 μm serving as the gate electrodes 4 and 4a are formed on the gate insulating film, thereby completing a signal charge transfer region. An insulating film 5 made of silicon glass containing phosphor (hereinafter referred to as a PSG film) is then formed to a thickness of about 1 μm and the resulting film is treated in a high temperature atmosphere to have fluidity, thereby flattening the film surface. Thereafter, an about 0.2 μm thick film of metal such as Mo, Ta or Ti is applied to the entire surface to form a light shielding member 11.

A silicon oxide or PSG film of about 0.5 μm serving as the insulating film 6 is then formed through vapor phase growth deposition in a reduced pressure atmosphere or normal pressure atmosphere at low temperatures. The insulating film 6 is then etched by using a resist-mask (not shown) and when the shielding member 11 is made of Mo, for example, an exposed portion of the shielding member 11 is dry etched in an atmosphere of a mixed gas of CF$_4$ gas and oxygen or wet etched with a solution of hydrogen peroxide and water mixed at a 1:1 ratio. In this case, etching of the Mo shielding member proceeds at a rate of 0.1 μm/min. Further, the underlying insulating film 5 and gate insulating film 3 are etched to form an opening 14 which exposes a portion of the surface of the N+-type source region 2a. If a series of boring steps for the formation of the opening 14 is carried out through a dry etching process, especially, performed simultaneously by means of a dry etching apparatus using parallel flat plates, the etching process can be simplified and in addition, a sharply steep sectional contour of the opening 14 can be obtained to ensure that embedding of an electroconductive film into the opening 14 to be described later can be made easy. After the opening 14 is formed, the light shielding electroconductive member 11 exposes to the peripheral wall of the opening 14. If, under this condition, the electroconductive film to be described later is embedded into the opening 14, the shielding member 11 will short-circuit to the embedded electroconductive film to prevent the storage of signal charges in the region 2a. Accordingly, the side edge of shielding member 11 exposed to the peripheral wall of the opening 14 is etched to retract the shielding member 11 with respect to the opening 14. An excessive retraction to a position above the gate electrode 4 or 4a will impair the electrical shielding against noise generated from the gate electrode. Generally, when considering accuracy of mask alignment in 2 $\mu$m design rule, the amount of retraction from the opening wall may preferably be about 0.5 to 1.0 $\mu$m. In addition, it is necessary to heat treat the insulating film 5 or 6 in a high temperature atmosphere or high pressure atmosphere in order that the insulating film 5 or 6 can have fluidity and the exposed edge of the shielding member 11 can be covered completely with the insulating film. When the shielding member 11 is made of Ti, an exposed edge of the shielding member 11 can be covered with a dense oxide film serving as an insulating film with less pin holes by simply oxidizing the exposed edge without resort to side-etching.

Figure 4C:
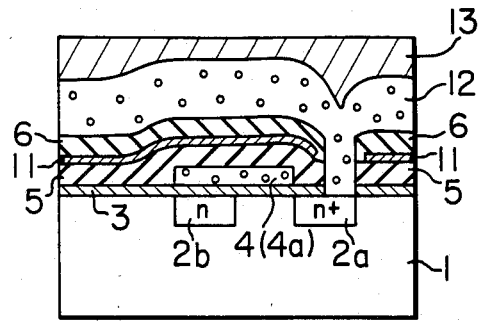

Referring now to FIG. 4c, a polycrystal silicon film 12 serving as an electroconductive film is formed to a thickness which is equal to or slightly greater than the height of the raised portion near the opening exposed to the N+-type source region 2a. The electroconductive film 12 may be formed through vapor phase growth deposition in a reduced pressure or normal pressure atmosphere or through plasma vapor phase growth deposition. Thereafter, an organic material of a resin system such as resist is applied to the surface of the substrate component through a spin coating process to form a resist-film 13 and its surface is smoothed. Especially, the coated resist-film can provide a highly flat planar surface.

Figure 4D:
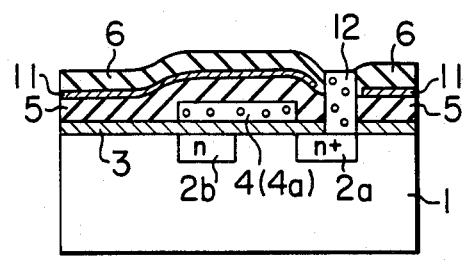

Subsequently, as shown in FIG. 4d, the resist-film 13 is etched with $CF_2Cl_2$ gas from its surface through, for example, a parallel flat plate type reactive sputter etching process under conditions such that the resist-film 13 and polycrystal silicon film 12 are etched at the same etching rate and that the applied power is 200 W, $CF_2Cl_2$ gas flow rate is about 20 cc/min., and the pressure is 60 mm Torr. This etching process is stopped when the surface of the insulating film 6 is exposed to the outside. In this manner, as shown in FIG. 4d, the polycrystal silicon film 12 is selectively embedded within the opening and the substrate component surface is flattened. Thereafter, an N-type impurity is doped into the polycrystal silicon film 12 to make the film 12 electroconductive. It should be understood that the electroconductive film 12 is embedded in the opening in communication with a portion of the surface of the N+-type source region 2a only for the purpose of flattening and the embedding of the electroconductive film 12 does not participate in improvement of the blooming characteristic. However, without the electroconductive film embedded, the steeply raised wall of the opening remains to degrade coverage of the subsequently formed photoconductive film, resulting in critical breakdown voltage and consequent generation of dark current.

When the film 12 is used, the initial doping of N-type impurity may be effected at low concentration for the formation of the N+-type source region 2a. More particularly, after the polycrystal silicon film 12 is embedded, the N-type impurity at high concentration may be diffused from the polycrystal silicon film 12 to a shallow portion of the region 2a to thereby enrich the N-type impurity concentration in the region 2a. This process for the formation of the N+-type source region 2a can advantageously reduce the junction capacitance. The electroconductive film 12 has been exemplified by the polycrystal silicon film with reference to FIG. 4c but it may include other electroconductive films of such high melting point metal as Mo, Ta, W or Ti.

Figure 4E:
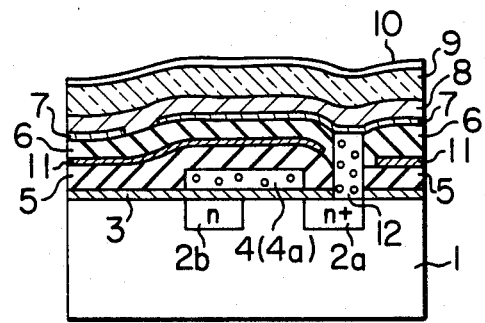

Turning to FIG. 4e, an about 0.1 $\mu$m thick metal electrode 7 made of, for example, Mo, Ta or Ti is formed and etched under the application of a resist-mask (not shown) to be patterned in units of picture elements. A positive hole blocking layer 8 of Zn, Se, ZnS or CdS is then formed on the metal electrode 7. Subsequently, a photoconductive film 9 of $(Zn_{1-x}Cd_xTe)_{1-y}(In_2Te_3)_y$ is formed and heat treated at a temperature of from 300° to 600° C. Thereafter, a transparent electrode 10 of an ITO film is formed. Although not shown, aluminum conductors acting as a wiring pattern for drive of the gate electrodes are applied in a well-known manner prior to the formation of the metal electrode 7. The light shielding electroconductive member 11 may make contact to a portion of the aluminum conductors to apply ground potential to the shielding member 11.

As described above, the method of producing a solid-state imaging device according to the present invention is advantageous in that a mask dedicated to the formation of the opening in the light shielding member 11 is not required, that patterning can be carried out with a common mask in a self-alignment manner, and that the mask alignment for masking the metal electrode to be patterned in units of picture elements can be achieved with sufficient tolerance.

Figure 5:
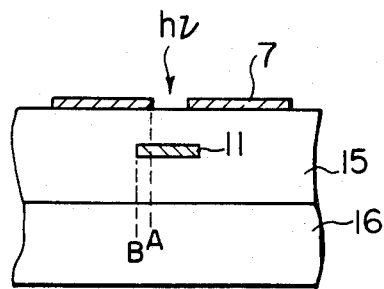
FIG. 5 is a diagrammatic representation for explaining overlapping between the electrode and the light shielding member.
Figure 6:
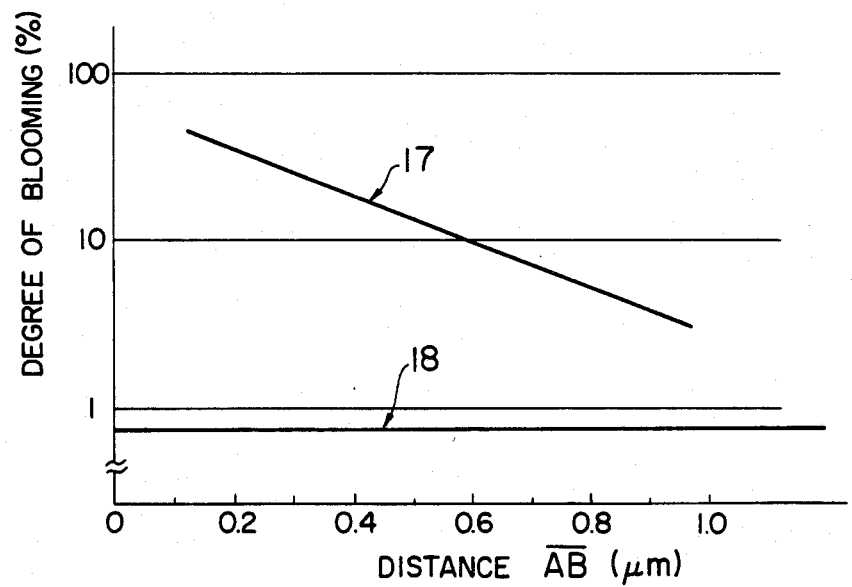
FIG. 6 is a graphic representation showing the relation between the degree of blooming and the overlapping.

As has been described, according to the present invention, the light shielding electroconductive member underlying the insulating film below the metal electrode separated in units of picture elements is formed to cover substantially the entire surface of the substrate component, so that light leaking from the gap in the metal electrode can be interrupted perfectly to prevent the generation of the blooming phenomenon even when registry of the metal electrode is disturbed, the metal electrode is dimensioned irregularly and the light is obliquely incident. To be more specific, when considering the construction of the device as schematically shown in FIG. 5, the degree of blooming depends on pattern overlapping, represented by a distance $\overline{AB}$, between edges of the Mo electrode 7 and the Mo light shielding member 11, as shown in FIG. 6. With the conventional device of FIG. 2, the distance $\overline{AB}$ ranges from 0.4 to 0.9 $\mu$m and the blooming is great as will be seen from a characteristic curve 17 shown in FIG. 6.

With the device of the present invention, the characteristic curve 18 in FIG. 6 is obtained, evidencing that the degree of blooming is minimized and constant. In FIG. 6, the degree of blooming is represented by a logarithmic value of percentage of transmitted light quantity with respect to saturated surface illumination when light (hv) which is 1000 times as intensive as the saturated surface illumination is irradiated on the device through an infrared cut filter. Further, since the charge transfer gate electrode is entirely covered with the shielding member, the stray capacitance between the metal electrode and the gate electrode can be reduced by connecting the shielding member to ground potential to shield noise attendant on the clock pulses, thereby providing a solid-state imaging device of high quality. The reduced stray capacitance can contribute to reduction of noise induced in the unit picture element electrode and suppression of varying bias potential of the photoconductive film, for stabilization of photo current, as well as production of sharp images without flicker. Moreover, the method of producing this invention is simplified since it does not require a mask dedicated to the formation of the opening in the light shielding electroconductive member 11. In addition, the electroconductive film such as polycrystal silicon film is embedded to communicate with a portion of the storage region surface in a self-alignment manner and the surface of the electroconductive film is flattened, thereby ensuring that the characteristics of the photoconductive film can be improved to promote the yield of successful devices.

We claim:

1. A solid-state imaging device comprising:
   a semiconductor circuit substrate having a signal charge storage region, a transfer region for transfer of signal charges stored in said storage region and a gate electrode;
   an insulating film formed on said semiconductor circuit substrate;
   an electrode divided into units of picture elements which overlie said insulating film and are electrically coupled to said storage region of said semiconductor circuit substrate through an opening formed in said insulating film;
   a hole blocking layer formed on the divided electrode and said insulating film;
   a photoconductive film formed on said hole blocking layer;
   a transparent electrode formed on said photoconductive film; and
   a light shielding electroconductive member disposed in said insulating film to cover the entire surface of said charge storage region, said transfer region, and said gate electrode without electrically contacting said divided electrode, said light shielding electroconductive member dividing said insulating film into upper and lower layers except for a portion surrounding said opening.

2. A solid-state imaging device according to claim 1 wherein said shielding member electrically shields said transfer region and said divided electrode.

3. A solid-state imaging device according to claim 1 wherein said shielding member is made of a high melting point metal.

4. A solid-state imaging device comprising:
   a semiconductor circuit substrate having a signal charge storage region, a transfer region for transfer of signal charges stored in said storage region and a gate electrode;
   an insulating film formed on said semiconductor circuit substrate, said insulating film having an opening therein at said storage region;
   an electrode divided into units of picture elements and formed on said insulating film;
   a hole blocking layer overlaying the divided electrode and said insulating film;
   a photoconductive film formed on said hole blocking layer;
   a transparent electrode formed on said photoconductive film; and
   a light shielding electroconductive member provided in said insulating film, except for said opening, to cover the entire surface of said transfer region, said gate electrode and said storage region being electrically connected with each other through an electroconductive film selectively embedded in said opening, the surface of the electroconductive film in said opening being positioned above said light shielding electroconductive member.

5. A solid-state imaging device according to claim 4 wherein said shielding member electrically shields said transfer region and said divided electrode.

6. A solid-state imaging device according to claim 4 wherein said shielding member is made of a high melting point metal.

7. A solid-state imaging device according to claim 4 wherein said electroconductive film is made of a high melting point metal.

8. A solid-state imaging device according to claim 4 wherein said electroconductive film comprises a polycrystal silicon film.

* * * * *